(12) United States Patent
Watanabe et al.

(10) Patent No.: US 9,887,341 B2
(45) Date of Patent: Feb. 6, 2018

(54) METHOD OF PRODUCTION OF CORE/SHELL TYPE NANOPARTICLES, METHOD OF PRODUCTION OF SINTERED BODY USING THAT METHOD, AND THERMOELECTRIC CONVERSION MATERIAL PRODUCED BY THAT METHOD

(71) Applicants: TOYOTA JIDOSHA KABUSHIKI KAISHA, Toyota-shi, Aichi-ken (JP); NATIONAL UNIVERSITY CORPORATION NAGOYA UNIVERSITY, Nagoya-shi, Aichi-ken (JP)

(72) Inventors: Masao Watanabe, Susono (JP); Mamoru Ishikiriyama, Fujieda (JP); Youhei Kinoshita, Shizuoka (JP); Nagahiro Saito, Nagoya (JP); Tomohito Sudare, Hagoya (JP); Tomoki Kodama, Toyota (JP)

(73) Assignees: TOYOTA JIDOSHA KABUSHIKI KAISHA, Toyota-shi, Aichi-ken (JP); NATIONAL UNIVERSITY CORPORATION NAGOYA UNIVERSITY, Nagoya-shi, Aichi-ken (JP)

( * ) Notice: Subject to any disclaimer, the term of this patent is extended or adjusted under 35 U.S.C. 154(b) by 225 days.

(21) Appl. No.: 14/608,351

(22) Filed: Jan. 29, 2015

(65) Prior Publication Data

US 2015/0221850 A1  Aug. 6, 2015

(30) Foreign Application Priority Data

Jan. 31, 2014  (JP) .................................. 2014-017569

(51) Int. Cl.
*H01L 35/34* (2006.01)
*B22F 1/00* (2006.01)
(Continued)

(52) U.S. Cl.
CPC ............ *H01L 35/34* (2013.01); *B22F 1/0003* (2013.01); *B22F 1/025* (2013.01); *B22F 3/10* (2013.01);
(Continued)

(58) Field of Classification Search
CPC ........ B22F 2202/13; B22F 9/24; B22F 1/025; B22F 2998/10; B22F 2999/00; B22F 1/0018; H01L 35/16; H01L 35/18
(Continued)

(56) References Cited

U.S. PATENT DOCUMENTS

2005/0268956 A1* 12/2005 Take ..................... B22F 1/025
136/208
2012/0238443 A1* 9/2012 Goia ..................... B22F 9/24
502/300

FOREIGN PATENT DOCUMENTS

CN  101311382 B  12/2011
JP  2002-45684 A  2/2002
(Continued)

OTHER PUBLICATIONS

Takai, Osamu. "Solution plasma processing (SPP)" 2008. Pure Appl. Chem. 80 (9). p. 2003-2011.*
(Continued)

*Primary Examiner* — Colleen P Dunn
*Assistant Examiner* — Nicholas A Wang
(74) *Attorney, Agent, or Firm* — Sughrue Mion, PLLC

(57) ABSTRACT

A method of production of core/shell type nanoparticles includes the following steps: a first step of applying a first power to cause the generation of the plasma so as to
(Continued)

selectively cause the precipitation of a first metal so as to form nanoparticles as cores and a second step of applying a second power which is larger than the first power to cause the generation of the plasma so as to cause the precipitation of a second metal which has a smaller oxidation reduction potential than the first metal on the core surface so as to form shells which are comprised of the second metal which cover the cores which are comprised of the first metal.

3 Claims, 10 Drawing Sheets

(51) Int. Cl.
*B22F 1/02* (2006.01)
*B22F 3/10* (2006.01)
*B22F 9/24* (2006.01)
*C22C 12/00* (2006.01)
*H01L 35/16* (2006.01)
*H01L 35/18* (2006.01)
*H01L 35/20* (2006.01)

(52) U.S. Cl.
CPC ............... *B22F 9/24* (2013.01); *C22C 12/00* (2013.01); *H01L 35/16* (2013.01); *H01L 35/18* (2013.01); *H01L 35/20* (2013.01); *B22F 1/0018* (2013.01); *B22F 2998/10* (2013.01); *B22F 2999/00* (2013.01)

(58) Field of Classification Search
USPC .............................................. 419/1
See application file for complete search history.

(56) References Cited

FOREIGN PATENT DOCUMENTS

| JP | 2005-294478 A | 10/2005 |
| JP | 2008-13810 A | 1/2008 |
| JP | 2011-195420 A | 10/2011 |

OTHER PUBLICATIONS

Junko Hieda, et al., "Solution Plasma Surface Modification for Nanocarbon-Composite Materials", The Japan Institute of Metals, 2009, pp. 938-942, vol. 73, No. 12.

Panuphong Pootawang, et al., "Ag nanoparticle incorporation in mesoporous silica synthesized by solution plasma and their catalysis for oleic acid hydrogenation", Materials Letters, 2011, pp. 1037-1040, vol. 65.

* cited by examiner

CHARGED VALUE IS
Te/Bi=1.5 ($Bi_2Te_3$)

METHOD OF PRODUCTION OF CORE/SHELL TYPE NANOPARTICLES, METHOD OF PRODUCTION OF SINTERED BODY USING THAT METHOD, AND THERMOELECTRIC CONVERSION MATERIAL PRODUCED BY THAT METHOD

TECHNICAL FIELD

The present invention relates to a method of production of core/shell type nanoparticles, a method of production of a sintered body using that method, and a thermoelectric conversion material which is produced by that method.

BACKGROUND ART

In the part, to produce a thermoelectric conversion material ($Bi_2$ $Te_3$ alloy etc.), the practice had been to add a reducing agent ($BaBH_4$ etc.) into a solution of a compound of the component elements ($BiCl_3$, $TeCl_4$, etc.) to cause the component elements to precipitate as composite nanoparticles (particle size: tens of nanometers or so or less), to alloy the composite nanoparticles by hydrothermal synthesis, and to sinter the alloy powder to obtain a thermoelectric conversion material ($Bi_2Te_3$ alloy etc.)

However, this method had the problems of the following points 1), 2), and 3):

1) Impurities (Na, B, etc.) which are derived from the reducing agent ($BaBH_4$ etc.) remain resulting in deterioration of the thermoelectric conversion characteristic of the final product. To remove the impurities, it is necessary to wash the composite nanoparticles before the hydrothermal synthesis, but complete removal is difficult. The level of impurities after washing is not constant, so in the end fluctuations in the thermoelectric conversion characteristic are unavoidable.

2) In the sintering process, among the component elements (Bi, Te, etc.), easily vaporizing elements (Te etc.) are lost due to vaporization, so the targeted alloy composition ($Bi_2Te_3$ etc.) cannot be realized and the inherent thermoelectric conversion properties cannot be obtained. As a countermeasure against this, it may be considered to add a larger amount of the easily vaporizing element anticipating the amount of vaporization loss. However, for example, Te is expensive, so a drop in yield should be avoided in terms of cost. Inherently, the extent of loss due to vaporization is not constant, so in the final analysis it is difficult to stably obtain the target composition.

3) Furthermore, there is the defect that the hydrothermal treatment which is required for alloying the composite particles invites an increase in energy and complication of the production process.

On the other hand, it is known to use the solution plasma method to prepare nanoparticles. PLT 1 discloses the method of causing the generation of plasma in an aqueous solution of a metal salt so as to form particle size 500 nm or less metal nanoparticles. The formed nanoparticles are gold, silver, rhodium, and platinum. Further, PLT 2 discloses a method of spraying microparticles which are formed using the solution plasma method together with a jet of multi-arc plasma so as to coat objects (not nanoparticles).

Furthermore, PLT 3 discloses a thermoelectric conversion material which is comprised of a core/shell structure which has a plurality of core parts and a shell part which covers these core parts. The examples show a core/shell type thermoelectric conversion material comprised of core parts of nanoparticles (3 nm) of ZnO oxides which are covered by a shell part of a $CoSb_3$ thermoelectric conversion material. The cores function as phonon scattering particles which raise the thermoelectric conversion characteristic. The solution plasma method is not alluded to.

None of these can solve the above problems 1) to 3).

CITATIONS LIST

Patent Literature

PLT 1: JP 2008-013810 A
PLT 2: JP 2002-045684 A
PLT 3: JP 2005-294478 A

SUMMARY OF INVENTION

Technical Problem

The present invention has as its object to use the solution plasma method to provide a method of production of core/shell type nanoparticles while solving the above problems 1), 2), and 3) of the prior art, a method of production of a sintered body using that method, and a thermoelectric conversion material which is produced by that method.

Solution to Problem

The inventors engaged in intensive studies and as a result came up with the following invention.

<1> A method of production of core/shell type nanoparticles by the solution plasma method, which method of production of core/shell type nanoparticles includes a process of causing the generation of plasma in a solution so as to reduce two types of metal salts which are dissolved in that solution and cause a first metal and a second metal to precipitate, which process includes the following steps:

a first step of applying a first power to cause the generation of said plasma so as to selectively cause the precipitation of said first metal so as to form nanoparticles as cores and a second step of applying a second power which is larger than said first power to cause the generation of said plasma so as to cause the precipitation of said second metal which has a smaller oxidation reduction potential than said first metal on said core surface so as to form shells which are comprised of said second metal which cover said cores which are comprised of said first metal.

<2> The method of production of core/shell type nanoparticles according to <1>, wherein said applied power is made to increase to said second power while application of said first power is causing the transmittance (%) of said solution to fall linearly with respect to time.

<3> The method of production of core/shell type nanoparticles according to <1> or <2>, wherein said power which is applied is made to increase from said first power to said second power when the transmittance (%) of said solution is in the range of [initial transmittance-3%] or less and [initial transmittance-5%] or more.

<4> The method of production of core/shell type nanoparticles according to any one of <1> to <3>, wherein said first metal and second metal are respectively Te and Bi, and cores which are comprised of Te are covered by shells which are comprised of Bi.

<5> The method of production of core/shell type nanoparticles according to any one of <1> to <3>, wherein said first metal is Au and said second metal is Cu or Co.

<6> A method of production of a thermoelectric conversion material which sinters core/shell type nanoparticles which are produced by any of <1> to <5>.

<7> A thermoelectric conversion material which is produced by the method of <6>.

Advantageous Effects of Invention

According to the present invention, the problem points 1), 2), and 3) of the prior art are solved as follows:
1) rather than using a reducing agent, the solution plasma method is used for reduction, so there are no impurities (Na, B, etc.) derived from the reducing agent (BaBH$_4$ etc.) and there is no deterioration of the thermoelectric conversion properties of the final product due to the impurities remaining like in the past. Therefore, washing for removing the impurities is unnecessary and the process of production can be simplified.
2) The easily vaporizing component element (Te etc.) is made the cores and this is sealed in the shells of the not easily vaporizing component element (Bi etc.), so is not lost due to vaporization in the sintering process. The target alloy composition (Bi$_2$Te$_3$ etc.) can be reliably realized and the inherent thermoelectric conversion properties are stably obtained. There is no need to add a larger amount of the easily vaporizing element anticipating the amount of vaporization loss and a high yield can be secured, so this is advantageous in terms of cost.
3) Furthermore, the alloying is performed at the time of sintering, so the hydrothermal treatment which was essential in the prior art is not required and an increase in energy and complication of the production process can be avoided.

DESCRIPTION OF EMBODIMENTS

Figure 1:
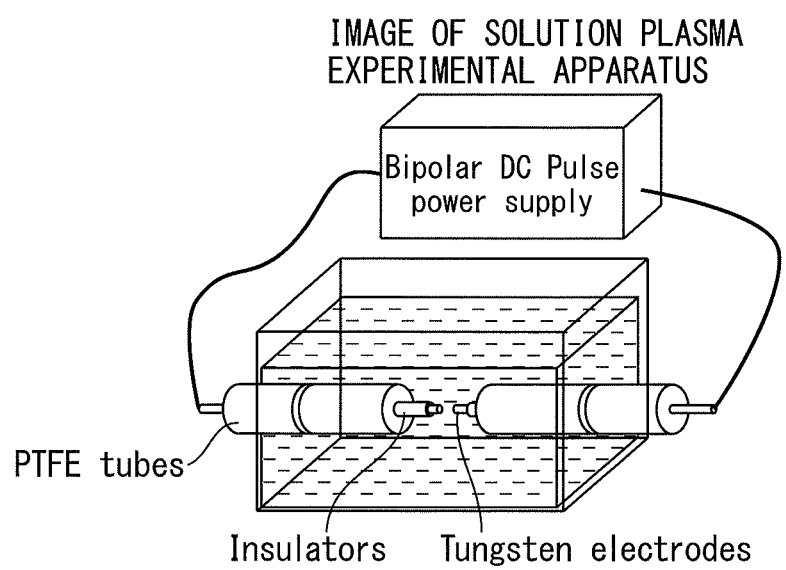
FIG. 1 is a schematic view which shows an apparatus for performing the solution plasma method.

In the present invention, when performing the solution plasma method in a solution in which several types (typically two types) of metal salts are dissolved, first, a small power is used to generate plasma and a large oxidation reduction potential (easily reducing) first metal is selectively made to precipitate to form core particles, then the plasma generating power is made to increase and a small oxidation reduction potential (not easily reducing) second metal is made to precipitate. The second metal precipitates on the surfaces of the first metal core particles which were first precipitated and formed so as to form shells. Due to this, core/shell type nanoparticles comprised of first metal cores sealed inside second metal shells are produced.

The solution in the present invention need only be one in which a plurality of different types of metal solts are dissolved. This is because if the types of metals differ, the oxidation reduction potentials differ, so it is possible to reduce the metal ions in the solution in stages. Therefore, the types of the metals selected need only be different from each other. There is no restriction on which metals to select.

The present invention is suitable for producing a thermoelectric conversion material, so it is preferable to select metals which form a thermoelectric conversion material. For example, metals which form selenium-based thermoelectric conversion materials, tellurium-based thermoelectric conversion materials, and antimony-based thermoelectric conversion materials are preferable. In addition to thermoelectric conversion materials, metals which form catalyst metals are preferable. Below, these will be explained.

As selenium-based thermoelectric conversion materials, there are Bi$_2$Se$_2$, PbSe, Sb$_2$Se$_2$, and AgSe. While not a thermoelectric conversion material, as a selenium-based material which is used for optical devices etc., that is ZnSe. Among these materials, for example, in the case of Bi$_2$Se$_2$, between Bi and Se, the one with the larger oxidation reduction potential becomes the first metal, while the one with the smaller oxidation reduction potential becomes the second metal.

As tellurium-based thermoelectric conversion materials, there are Bi$_2$Te$_3$, PbTe, Ag$_2$Te, and La$_2$Te$_3$. While not a thermoelectric conversion material, as a tellurium-based material which is used for a light emitting diode etc., that is ZnTe. Further, as a tellurium-based material which is used for an IR lens etc., that is CdTe. Among these tellurium-based materials, Bi$_2$Te$_3$ is typical, so this will be explained in detail later.

As antimony-based thermoelectric conversion materials, those are Zn$_4$Sb$_3$ and PbSb. While not a thermoelectric conversion material, as an antimony-based material which is used as a Hall device, that is InSb. Among these materials, for example, in the case of Zn$_4$Sb$_3$, between Zn and Sb, the one with the larger oxidation reduction potential becomes the first metal, while the one with the smaller oxidation reduction potential becomes the second metal.

As examples of application other than for thermoelectric conversion materials, those are an Au core/Cu shell type catalyst metal and an Au core/Co shell type catalyst metal. These catalyst metals will be explained later in detail.

Further, the case where three or more types of metal salts are included will be explained. As thermoelectric conversion materials, for example, there are AgSbTe$_2$, BiSbTe, BiSbTeSe, Zn$_4$(Sb$_{0.97}$Sn$_{0.03}$)$_3$, In$_x$Co$_4$Sb$_{12}$ (0<x<1), and other thermoelectric conversion materials.

Next, the method of switching from application of the first power to application of the second power will be explained. Along with precipitation of the metal particles and particle growth, the transmittance of the solution falls. This is utilized to obtain a grasp of the state of precipitation of metal and particle growth due to application of power.

The method of measuring the transmittance is not particularly limited, but UV-vis analysis (visible ultraviolet spectrometry) is preferable from the viewpoint of precision etc.

The judgment criteria for switching may be determined based on the idea of stopping precipitation of the first metal and starting precipitation of the second metal when the core which is formed by the first metal has grown to a size big enough for starting formation of the shell by the second metal. To start formation of the shell by the second metal, the size of the core which is formed by the first metal is preferably an extent of over several nm.

Until the size of the core which is formed by the first metal becomes an extent over several nm, during application of the first power, the transmittance falls slowly and linearly by a substantially constant rate of fall, so it is preferable to switch from the first power to the second power during this period.

Such a period, in most cases, is one where the transmittance is a value in a range of [initial transmittance-3%] to [initial transmittance-5%]. Therefore, the fact of the transmittance being in this period may be used as the judgment criteria for switching.

Next, typical aspects will be used to further explain what has been explained up to here.

In a typical aspect, the present invention can be applied to production of a $Bi_2Te_3$ thermoelectric conversion material. That is, the solution plasma method is performed in a solution in which Bi salts and Te salts are dissolved by two stages of power values of a small value and a large value. First, if using a small power value to cause the generation of plasma, among Bi and Te, the large oxidation reduction potential easily reducing Te precipitates as the first metal to form core particles. Next, if using a large power value to cause the generation of plasma, among Bi and Te, the small oxidation reduction potential not easily reducing Bi precipitates as the second metal. This Bi precipitation occurs preferentially on the already present Te core particles. Due to this, core/shell type nanoparticles comprised of Te cores sealed inside Bi shells are obtained.

Due to this Te core/Bi shell structure, the easily vaporizing Te is prevented from being lost by vaporization during sintering and the inherent $Bi_2Te_3$ composition is stably secured. FIG. 1 schematically shows a solution plasma apparatus which is used for the present invention. By applying voltage across the electrodes in the solution, the solution is locally heated between the electrodes and insulation breakdown occurs in the fine bubbles which are produced whereby plasma discharge is started.

Figure 2:
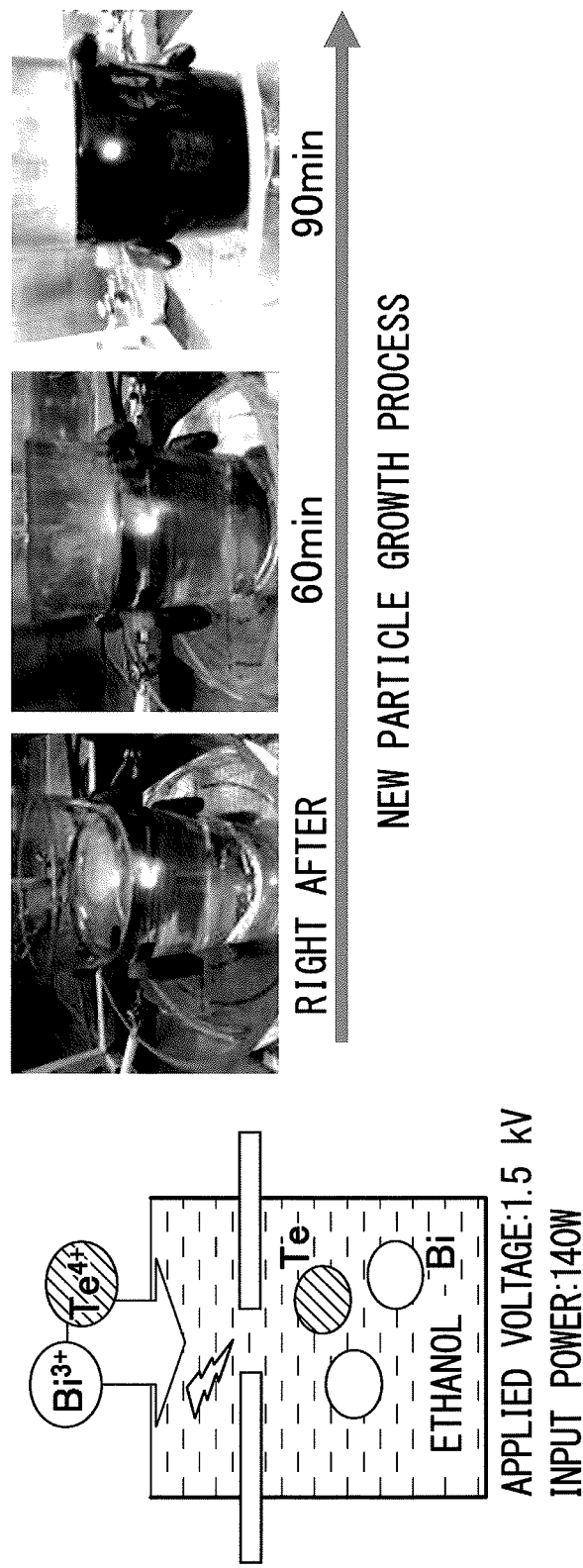
FIG. 2 is a view which shows changes in the transmittance of a solution accompanying precipitation of Bi and Te by the solution plasma method and particle growth.

FIG. 2 shows the changes of the transmittance of a solution accompanying precipitation of Bi and Te according to the solution plasma method and particle growth. Bi and Te precipitate in the solution which is shown at the left end in the figure. The three photographs aligned at the right show the state of the drop of the transmittance of the solution in accordance with the increase in the amount of precipitation along with time (number and size of precipitates). In the present invention, the small power value at the first stage for causing precipitation of the cores is switched to the large power value at the second stage for causing precipitation of the shells at the point of time when the transmittance of the solution, which is used to monitor the amount of precipitation, reaches a preset transmittance. Below, examples will be used to explain the present invention in further detail.

EXAMPLES

Comparative Example 1

For comparison, the prior art using a reducing agent was used to prepare a $Bi_2Te_3$ thermoelectric conversion material. The following starting solution and reducing agent solution were prepared.

Figure 3:
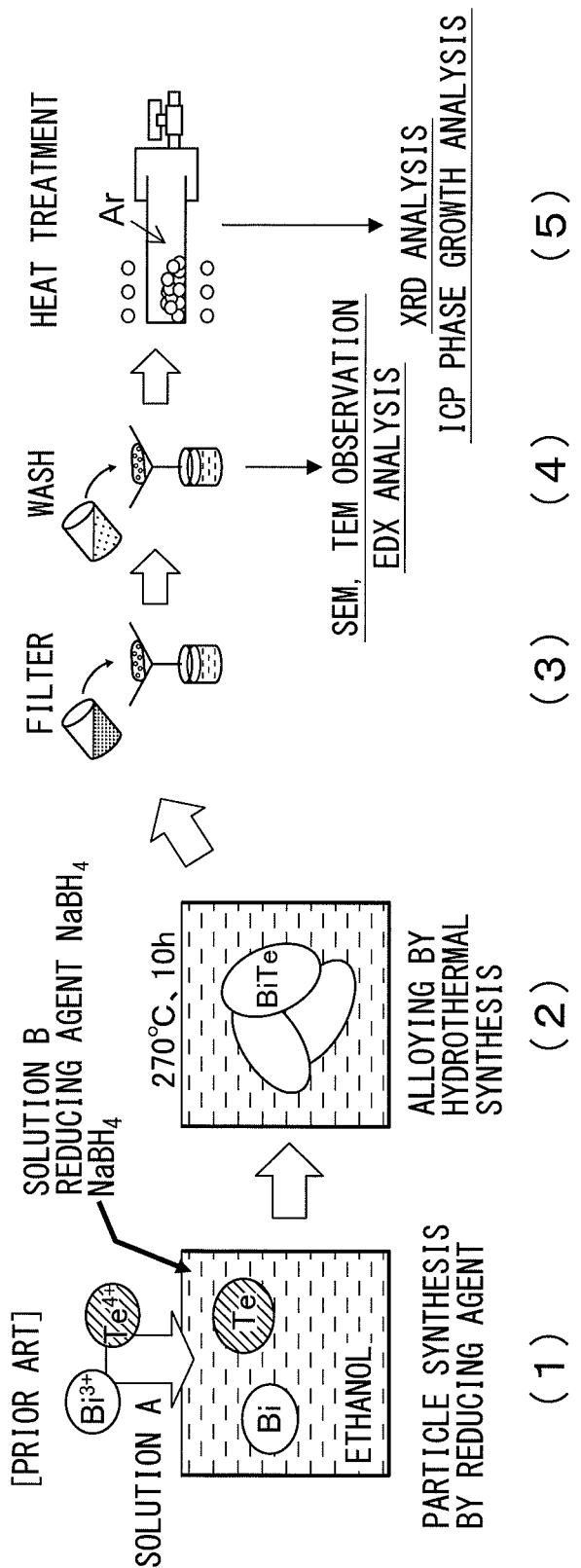
FIG. 3 is a schematic view which shows the procedure for production of a Bi$_2$Te$_3$ thermoelectric conversion material according to the prior art (Comparative Example 1).

Starting Solution
$BiCl_3$: 0.170 g
$TeCl_4$: 0.214 g
Ethanol: 100 ml
Reducing Agent Solution
$NaBH_4$: 0.218 g
Ethanol: 100 ml FIG. 3 shows the procedure for preparation.

First, as shown in (1), the reducing agent solution was added to the starting solution to cause Bi and Te to precipitate. The obtained Bi and Te mixed powder, as shown in (2), was alloyed by hydrothermal synthesis. Next, the product was (3) filtered and (4) washed to remove the impurities. The obtained alloyed powder was observed under an SEM, observed under a TEM, and analyzed by EDX. Finally, the alloy powder was (5) sintered to obtain a $Bi_2Te_3$ thermoelectric conversion material. This $Bi_2Te_3$ thermoelectric conversion material was analyzed by XRD and by ICP.

Comparative Example 2

For comparison, the solution plasma method was used to prepare a $Bi_2Te_3$ thermoelectric conversion material without switching power according to the present invention. The following starting solution, voltage, and power were used.

Starting Solution
$BiCl_3$: 0.170 g
$TeCl_4$: 0.214 g
Ethanol: 200 ml
Voltage and Power
Applied voltage: 1.5 kV
Input power: 50 W (constant)

Figure 4:
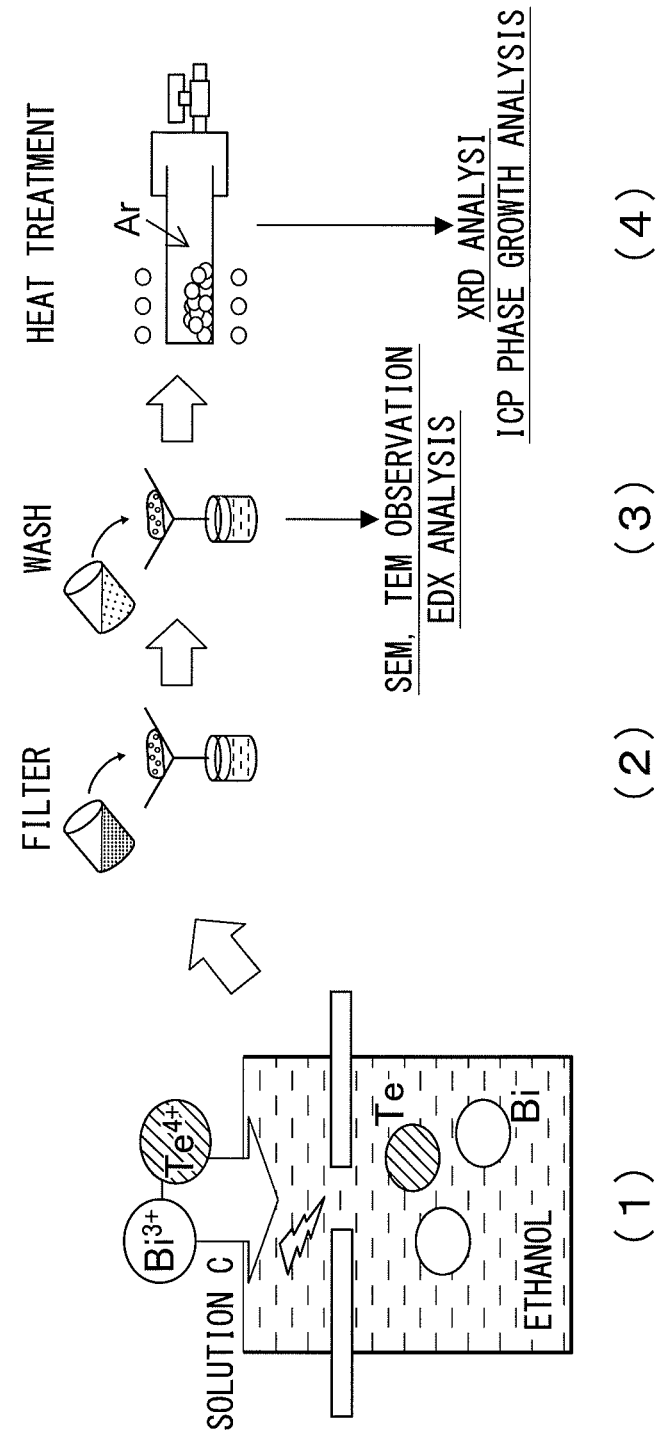
FIG. 4 is a schematic view which shows the procedure for production of a Bi$_2$Te$_3$ thermoelectric conversion material according to the solution plasma method (Comparative Examples 2 and 3 and Example 1).

FIG. 4 shows the procedure for preparation. First, as shown in (1), a voltage of 1.5 kV was applied in the starting solution between the electrodes and a 50 W constant power was input to cause Bi and Te to precipitate. The obtained Bi and Te mixed powder was (2) filtered and (3) washed to remove the impurities, then was observed by an SEM, observed by a TEM, and analyzed by EDX. Finally, the mixed powder was (4) sintered to obtain a $Bi_2Te_3$ thermoelectric conversion material. This $Bi_2Te_3$ thermoelectric conversion material was analyzed by XRD and by ICP.

Comparative Example 3

For comparison, the solution plasma method was used to prepare a $Bi_2Te_3$ thermoelectric conversion material without switching power according to the present invention. The following starting solution, voltage, and power were used.

Starting Solution
$BiCl_3$: 0.170 g
$TeCl_4$: 0.214 g
Ethanol: 200 ml
Voltage and Power
Applied voltage: 1.5 kV
Input power: 140 W (constant)

FIG. 4 shows the procedure for preparation.

First, as shown in (1), a voltage of 1.5 kV was applied in the starting solution between the electrodes and a 140 W constant power was input to cause Bi and Te to precipitate. The obtained Bi and Te mixed powder was (2) filtered and (3) washed to remove the impurities, then was observed by an SEM, observed by a TEM, and analyzed by EDX. Finally, the mixed powder was (4) sintered to obtain a $Bi_2Te_3$ thermoelectric conversion material. This $Bi_2Te_3$ thermoelectric conversion material was analyzed by XRD and by ICP.

Example 1

The solution plasma method was used to prepare a $Bi_2Te_3$ thermoelectric conversion material while switching power according to the present invention. The following starting solution, voltage, and power were used.

Starting Solution
$BiCl_3$: 0.170 g
$TeCl_4$: 0.214 g
Ethanol: 200 ml
Voltage and Power
Applied voltage: 1.5 kV
Input power: 50 W->140 W (switching)

FIG. 4 shows the procedure for preparation.

First, as shown in (1), a voltage of 1.5 kV was applied in a starting solution between electrodes, first 50 W of power was input to cause Te to precipitate to form core particles, next the input power was increased to 140 W to cause Bi to precipitate to form shells. The obtained Te core/Bi shell core/shell powder was (2) filtered, (3) washed to remove the impurities, then observed by SEM, observed by TEM, and analyzed by EDX. Finally, the core/shell powder was (4) sintered to obtain a $Bi_2Te_3$ thermoelectric conversion material. This $Bi_2Te_3$ thermoelectric conversion material was analyzed by XRD and by ICP.

Figure 5:
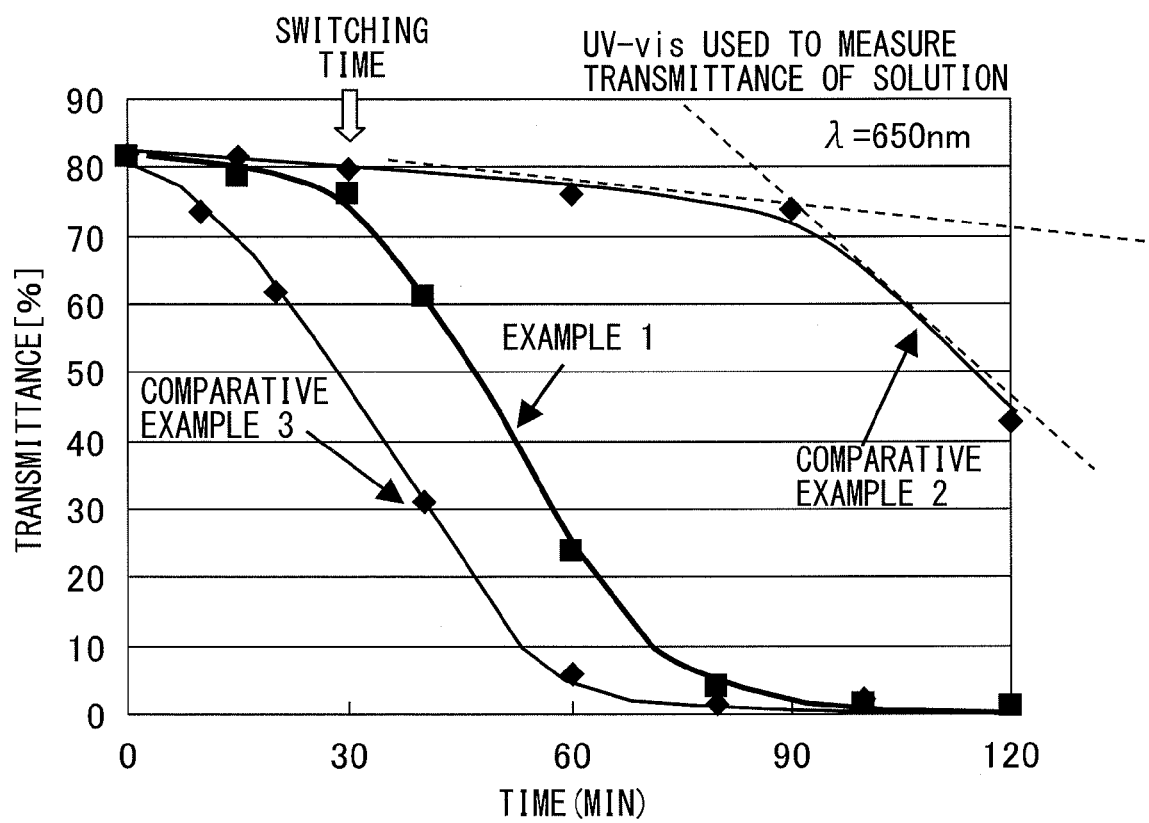
FIG. 5 is a graph which shows the relationship between the elapsed time and transmittance of the solution in Comparative Examples 2 and 3 and Example 1 by the solution plasma method.

Referring to FIG. 5, the timing of switching the power value will be explained. FIG. 5 shows changes in the transmittance of the solution with respect to elapsed time.

Comparative Example 2 was performed without changing the input power by a small power value of 50 W from start to finish. For this reason, the large oxidation reduction potential easily reducing Te selectively precipitated. The increase in the amount of deposition along with the elapse of time caused the transmittance to drop. In the figure, the transmittance fell slowly linearly with respect to time until 90 minutes of elapsed time (that is, by a substantially constant small rate of drop), the transmittance fell in a curve with respect to time near 90 minutes of elapsed time (that is, by a substantially continuously increasing rate of drop), then the transmittance fell rapidly linearly with respect to time (that is, by a substantially constant large rate of drop). This is believed to be because up to about 90 minutes, the number of primary particles of Te increased, then the primary particles agglomerated and the particle size increased.

As opposed to this, Comparative Example 3 was performed without changing the input power by a large power value of 140 W from start to finish. In this case, Te of course and also the small oxidation reduction potential not easily reducing Bi precipitated, so the transmittance fell rapidly in a short time.

Example 1 according to the present invention was performed by first making the Te selectively precipitate by a small power value of 50 W, next switching to the large power value 140 W. The timing of this switching may be the point of time when the transmittance of the solution (%) becomes a value in the range of the [initial transmittance-3%] to the [initial transmittance-5%]. In this example, as shown in FIG. 5, the initial transmittance is 80%, so the point of time when the transmittance falls from [80%-3%] to [80%-5%], that is, a range of 77% to 75%, is the timing of switching.

That is, before the easily reducing element forms the cores and grows to an extent exceeding the nanosize (tens of nm), it is suitable to switch from the small power to the large power to start the formation of the shells. The power switching timing which is employed in the present example is shown as "switching time" at the top of FIG. 5. In general, not limited to a Te—Bi-based composition, but in other compositions as well, the applied power is made to increase from a small power to large power in the period when the transmittance drops linearly slowly with respect to time by a small power (that is, a substantially constant rate of drop).

The transmittance of the solution can be measured by UV-vis analysis (ultraviolet visible spectrometry).

Observation and Analysis of Powder

Figure 6:
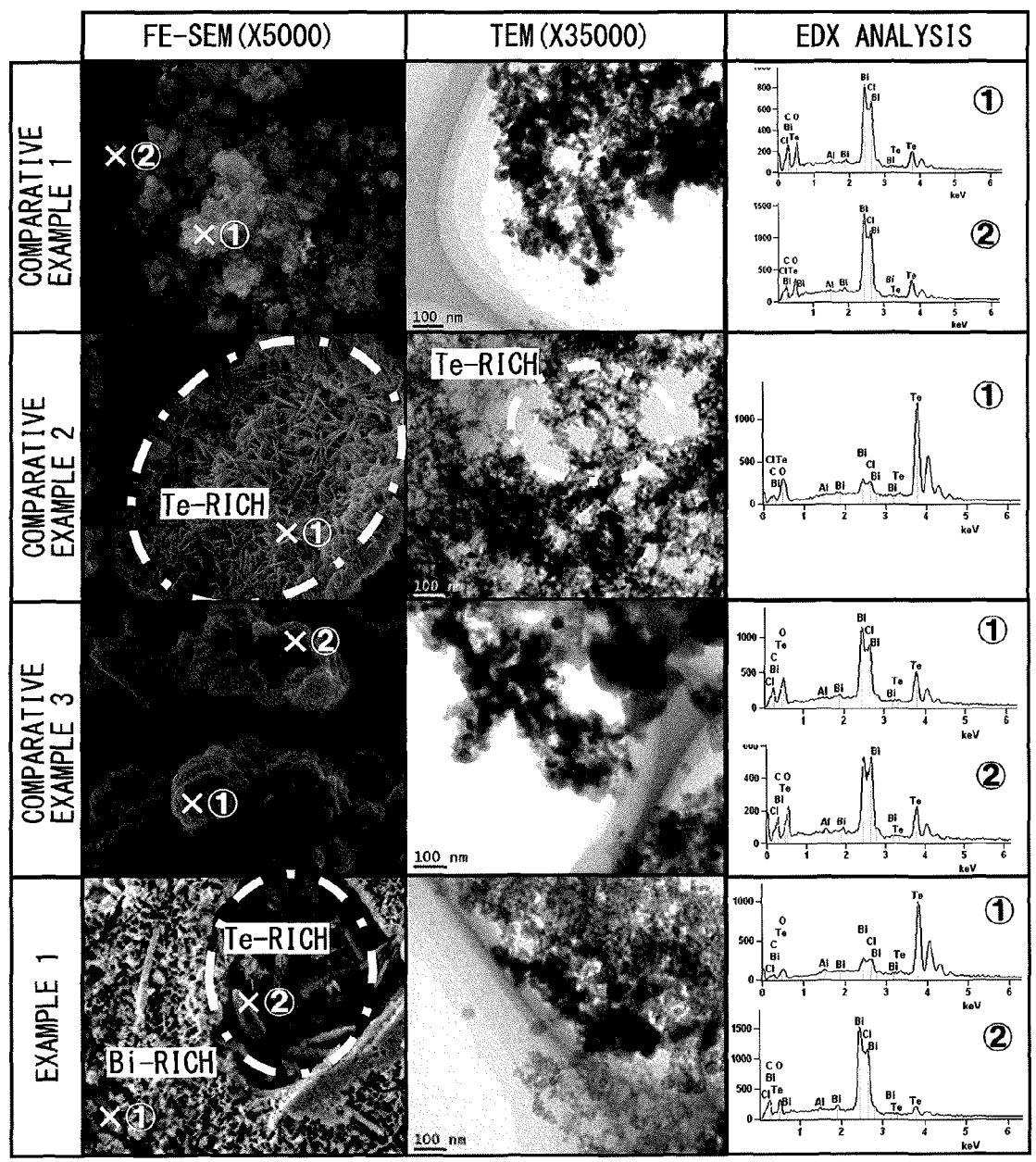
FIG. 6 is a view which shows together FE-SEM images, TEM images, and EDX analysis charts for the core/shell type nanoparticles which were obtained by Comparative Examples 1, 2, and 3 and Example 1.

FIG. 6 shows together the results of SEM observation, TEM observation, and EDX analysis for the powder samples (before sintering) which were obtained in Comparative Examples 1, 2, and 3 and Example 1.

Comparative Example 1 is a powder sample which was prepared by the prior art using a reducing agent. Two observed locations were similarly analyzed by EDX whereby a Bi peak and Te peak were detected. It is learned that Bi and Te were uniformly mixed together.

Comparative Example 2 is a powder sample which was prepared by the solution plasma method while inputting a constant small power (50 W) from start to finish. From a comparison of the peak strengths of Bi and Te in EDX analysis, it is learned that the large oxidation reduction potential easily reducing Te was precipitated with priority.

Comparative Example 3 is a powder sample which was prepared by the solution plasma method while inputting a constant large power (140 W) from start to finish. Two observed locations were similarly analyzed by EDX whereby a Bi peak and Te peak were detected. It is learned that not only the easily reducing Te, but also the small oxidation reduction potential not easily reducing Bi precipitated concurrently. It is learned that in the same way as Comparative Example 1 according to the prior art, Bi and Te were uniformly mixed together.

Example 1 shows a powder sample which was prepared by switching the input power from a small power value to a large power value by the solution plasma method in accordance with the present invention. That is, a Te-rich region (location 2 of FE-SEM photo) obtained by a small power (50 W) being input at the first step so that the large oxidation reduction potential easily reducing Te selectively precipitated and a Bi-rich region (location 1 of FE-SEM photo) obtained by a large power (140 W) being input at the second step so that the small oxidation reduction potential not easily reducing Bi precipitated clearly exist as separate phases.

At the second step of large power, Te had already selectively precipitated at the first step and remained in only a slight amount in the solution, so the amount of precipitation at the second step was slight. Bi did not precipitate much at all in the first step and remained in a large amount, so the amount of precipitation in the second step was overwhelmingly large. Furthermore, from the FE-SEM image and TEM image, it is learned that the Bi-rich phase 1 surrounded the Te-rich phase 2 and that a Te core/Bi shell structure was formed.

Figure 7:
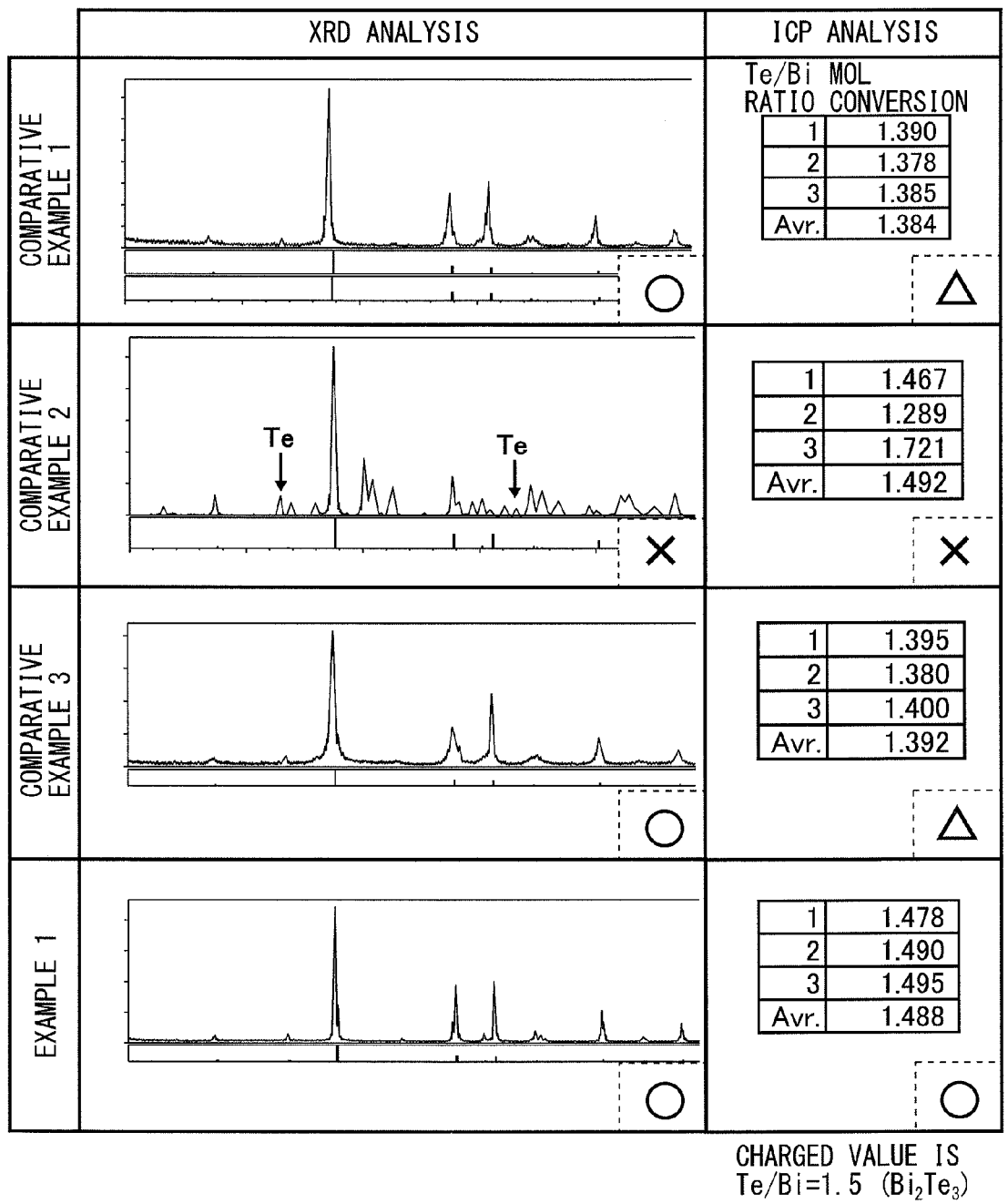
FIG. 7 is a view which shows together the XRD analysis charts and ICP analysis values for the Bi$_2$Te$_3$ thermoelectric conversion materials which are obtained by Comparative Examples 1, 2, and 3 and Example 1.

Analysis of Thermoelectric Conversion Material FIG. 7 shows together the results of XRD analysis and ICP analysis for the thermoelectric conversion materials (sintered bodies) which were obtained at Comparative Examples 1, 2, and 3 and Example 1.

From the results of XRD analysis, Comparative Example 1 (prior art using reducing agent), Comparative Example 3 (solution plasma method with large powder from start to finish), and Example 1 (solution plasma method with power switched from small to large according to the present invention) exhibited clear peaks from a $Bi_2Te_3$ crystal lattice. The formation of a $Bi_2Te_3$ thermoelectric conversion material alloy could be confirmed. As opposed to this, Comparative Example 2 was unclear in $Bi_2Te_3$ crystal lattice (Te made to precipitate preferentially by the solution plasma method by a small power from start to finish) and incomplete in formation of $Bi_2Te_3$ alloy.

From the results of the ICP analysis, according to the present invention of Example 1, a value closest to the stoichiometric mixture ratio Te/Bi=1.5 (charged values) was stably obtained for the three observed points. It is learned that at the time of sintering, it is possible to effectively prevent vaporization loss of Te.

As opposed to this, the Te/Bi ratios of Comparative Examples 1 to 3 were all inferior to Example 1 of the present invention.

In Comparative Example 1 of the prior art method, it is learned that the average value of the three observed points was the lowest and the amount of vaporization of Te at the time of sintering was large.

Figure 8:
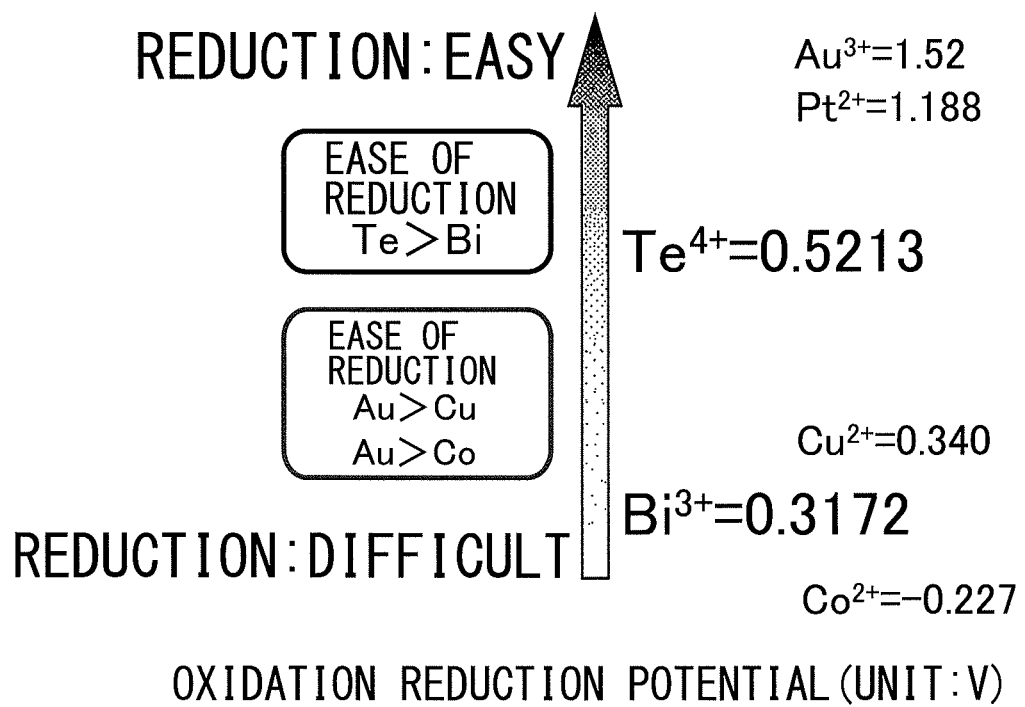
FIG. 8 is a view which shows the oxidation reduction potentials for elements which are used in the examples and comparative examples.

FIG. 8 shows a comparison of the oxidation reduction potentials of elements which were used in the comparative examples and examples. Further, Table 1 shows the saturated vapor pressure characteristic, while Table 2 shows the melting point and boiling point for Bi and Te.

TABLE 1

Saturated Vapor Pressure Characteristics

| | Temperature (° C.) | | |
|---|---|---|---|
| | 1 mmHg | 100 mmHg | 760 mmHg |
| Bi | 1021 | 1271 | 1420 |
| Te | 520 | 838 | 1087 |

TABLE 2

Melting Point and Boiling Point

| | Temperature (° C.) | |
|---|---|---|
| | Melting point | Boiling point |
| Bi | 271.5 | 1564 |
| Ti | 449.51 | 988 |

Figure 9:
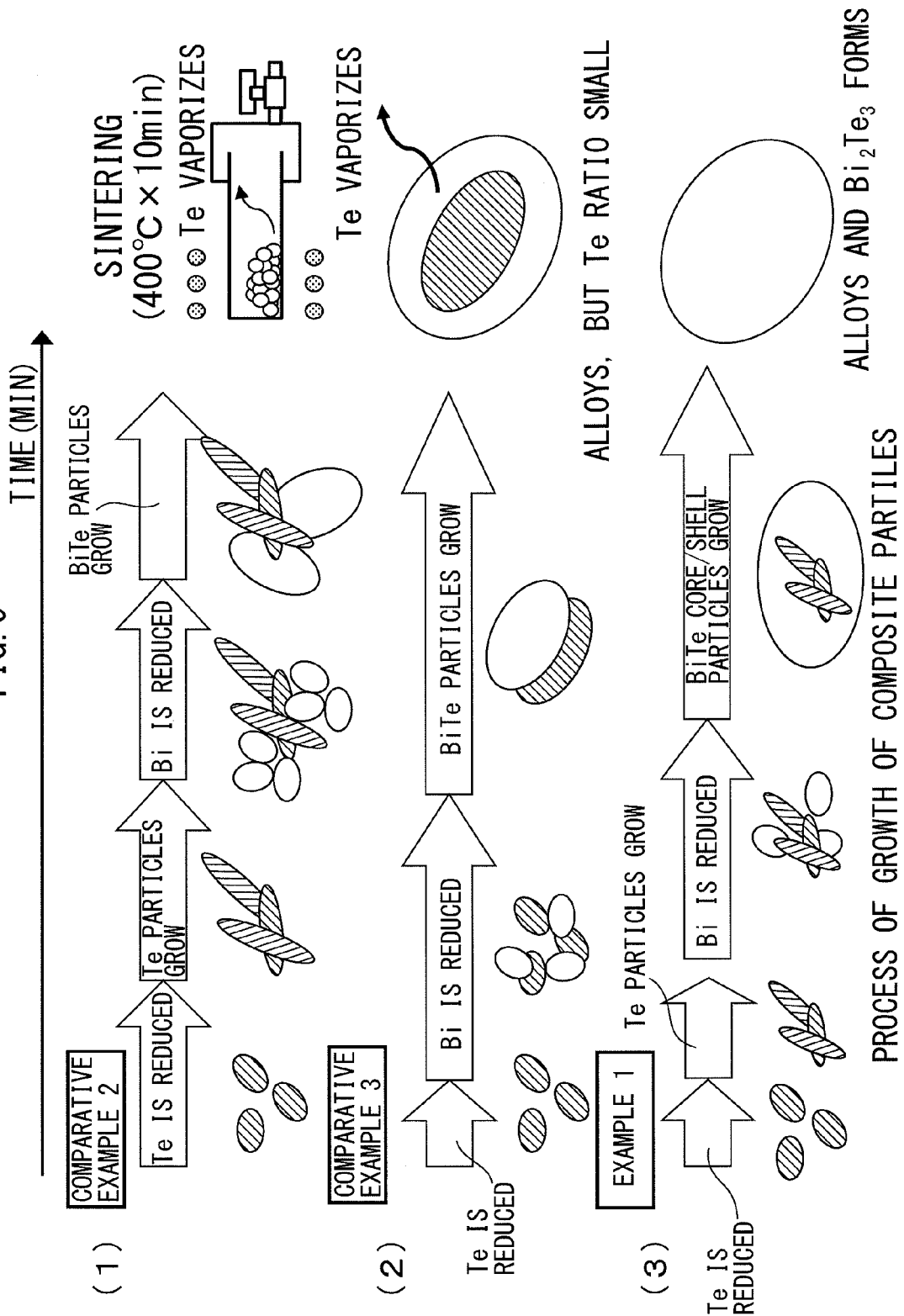
FIG. 9 is a schematic view which shows a comparison of the states of progress of the reactions in Comparative Examples 2 and 3 and Example 1 according to the solution plasma method.

Comparative Examples 2 and 3 and Example 1 which applied the solution plasma method were compared for process of formation of composite particles and behavior at the time of sintering while referring to FIG. 9

As shown in FIG. 9(1), in Comparative Example 2, a constant small power was input from the start to finish, so first Te was reduced and precipitated and Te particles grew, then Bi was reduced and BiTe composite particles grew. However, the "composite" in this case is just the case where the Bi particles and the Te particles were simply mixed together in copresence. A core/shell structure was not formed.

In the case of this Comparative Example 2, in the results of analysis by ICP of FIG. 7, the average value of the three observed points was close to the charged value 1.5, but in the three observed points, there was a large variation from the maximum value of 1.721 to the minimum value of 1.289. As suggested from the XRD analysis of FIG. 7, it is believed that the formation of an alloy in the sintering process was incomplete.

As shown in FIG. 9(2), in Comparative Example 3, a constant large power was input from start to finish, so right after Te started to be reduced and precipitated, Bi started to be reduced and precipitated and BiTe composite particles grew. However, in this case as well, even if referred to as "composite", the Bi particles and the Te particles were simply mixed together in copresence. A core/shell structure was not formed.

In the case of Comparative Example 3, as explained above, in the analysis by XRD of FIG. 7, a peak from the $Bi_2Te_3$ crystal lattice was clearly recognized and an alloy was formed, but as explained above, a core/shell structure was not formed, so the Te/Bi ratio fell due to vaporization of Te in the sintering process.

As shown in FIG. 9(3), in Example 1, a core/shell structure comprised of the Te cores which were formed by the first step of input of small power covered by Bi shells which were formed by the second step of input of large power was formed, so in the sintering process, vaporization of Te was prevented while alloying was achieved and a Te/Bi ratio close to the stoichiometric mixture ratio could be stably secured.

Example 2

The solution plasma method was used to prepare Au core/Cu shell core/shell type nanoparticles useful as catalyst metal while switching power according to the present invention. The following starting solution, voltage, and power were used.

Starting Solution

Tetrachloroauric (III) acid [$HAuCl_4.4H_2O$]: 1.2 mmol
Copper acetate (II) [$Cu(CH_3COO)_2.H_2O$]: 4.8 mmol
NaI: 5 mmol
Ethanol: 200 ml Voltage and Power Applied voltage: 1.5 kV
Input power: 50 W->140 W (switching)

Figure 10:
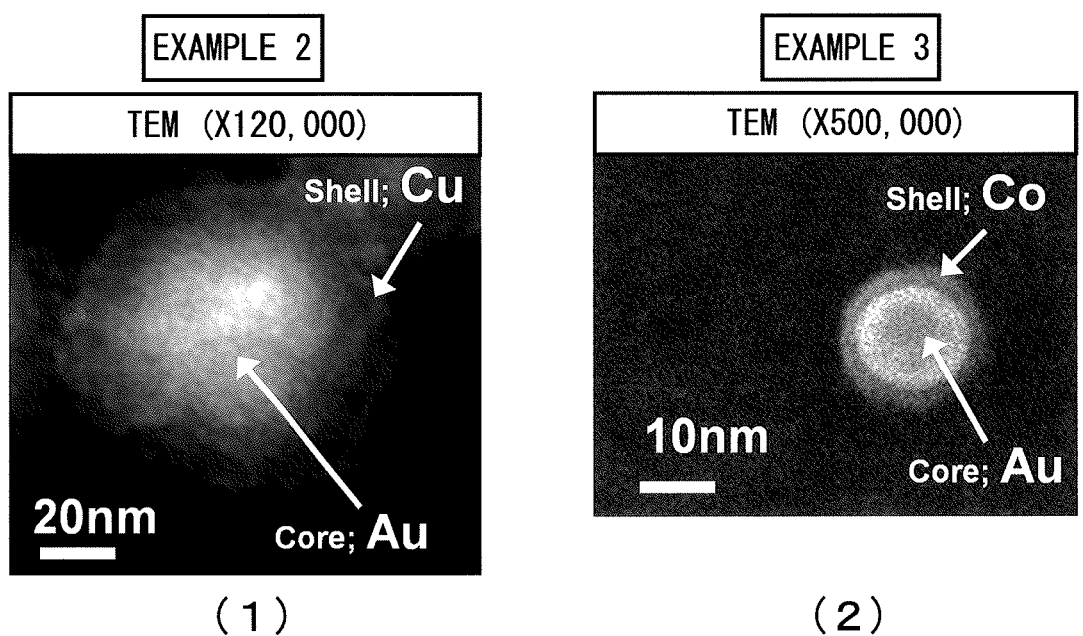
FIG. 10 is a view which shows TEM images of core/shell type nanoparticles which are prepared by the solution plasma method in (1) Example 2 and (2) Example 3.

FIG. 10(1) shows a TEM image of a powder sample. It will be understood that an Au core/Cu shell core/shell structure was formed.

Example 3

The solution plasma method was used to prepare Au core/Co shell core/shell type nanoparticles useful as catalyst metal while switching power according to the present invention. The following starting solution, voltage, and power were used.

Starting Solution

Tetrachloroauric (III) acid [$HAuCl_4.4H_2O$]: 1.2 mmol
Cobalt acetate (II) [$Co(CH_3COO)_2.4H_2O$]: 4.8 mmol
NaI: 5 mmol
Ethanol: 200 ml Voltage and Power Applied voltage: 1.5 kV
Input power: 50 W->140 W (switching)

FIG. 10(2) shows a TEM image of a powder sample. It will be understood that an Au core/Co shell core/shell structure was formed.

Above, examples of application of the method of the present invention to the production of a $Bi_2Te_3$ thermoelectric conversion material (Example 1) and production of an Au core/Cu (or Co) shell type catalyst metal (Examples 2 and 3) were explained, but the present invention is not limited to these. For example, it can also be applied to the following:

TABLE 3

| Composition | Materials | Examples of application |
|---|---|---|
| Selenium based | BiSe$_3$ | Thermoelectric conversion |
| | PbSe | Thermoelectric conversion |
| | Sb$_2$Se$_3$ | Thermoelectric conversion |
| | ZnSe | Optical components, infrared sensors, night vision apparatuses, IR optics, scintillators, substrates, modulators |
| | AgSe | Thermoelectric conversion |
| Tellurium based | PbTe | Thermoelectric conversion |
| | Ag$_2$Te | Thermoelectric conversion |
| | (AgSbTe$_2$) | Thermoelectric conversion |
| | La$_2$Te$_3$ | Thermoelectric conversion |
| | ZnTe | Light emitting diode or laser diode, IR optics, substrates, THz detectors, THz emitters |
| | CdTe | IR optics, electro optical modulators, substrates, detectors crystal pieces for vacuum deposition |
| Antimony-based | Zn$_4$SB$_3$ | Thermoelectric conversion |
| | InSb | Hall elements and magneto resistive elements |
| | PdSb | Thermoelectric conversion |
| Sulfur based | ZnS | Photosensors, IR optics, IR optics, polarizers, beam splitters, ½ and ¼ waveplates, substrates |
| | CdS | Photoconductive cells, photosensors |
| | PdS | Solar cells |
| Multi element based | BiSbTe | Thermoelectric conversion |
| | BiSbTeSe | Thermoelectric conversion |
| | Zn$_4$(Sb$_{0.97}$Sn$_{0.03}$)$_3$ | Thermoelectric conversion |
| | In$_x$CO$_4$Sb$_{12}$ (0 < x < 1) | Thermoelectric conversion |

INDUSTRIAL APPLICABILITY

According to the present invention, the solution plasma method can be used to form core/shell type nanoparticles. Due to this, typically, in the production of a thermoelectric conversion material, it is possible to prevent the vaporization of an easily vaporizing element in the sintering process so as to secure the targeted chemical composition, possible to easily achieve high purity since there is no contamination by impurities derived from the reducing agent, and possible to reduce the production costs since a hydrothermal reaction is not required for alloying.

The invention claimed is:

1. A method of production of core/shell nanoparticles by the solution plasma method,
   which method of production of core/shell nanoparticles includes a process of causing the generation of plasma in a solution so as to reduce two kinds of metal salts which are dissolved in that solution and cause a first metal and a second metal to precipitate,
   which process includes the following steps:
   a first step of applying a first power to cause the generation of said plasma so as to selectively cause the precipitation of said first metal so as to form nanoparticles as cores and
   a second step of applying a second power which is larger than said first power to cause the generation of said plasma so as to cause the precipitation of said second metal which has a smaller oxidation reduction potential than said first metal on said core surface so as to form shells which are comprised of said second metal which cover said cores which are comprised of said first metal,
   wherein the first metal and second metal are respectively Te and Bi, and cores which are comprised of Te are covered by shells which are comprised of Bi, and
   wherein a reducing agent is not used in the process.

2. The method of production of core/shell nanoparticles according to claim 1, wherein said applied power is made to increase to said second power while application of said first power is causing the transmittance, in terms of percentage, of said solution to fall linearly with respect to time.

3. The method of production of core/shell nanoparticles according to claim 1, wherein said power which is applied is made to increase from said first power to said second power when the transmittance, in terms of percentage, of said solution is in the range of a initial transmittance-3% or less and the initial transmittance-5% or more.

* * * * *